United States Patent [19]

Beun

[11] 4,423,466
[45] Dec. 27, 1983

[54] SUPPORTS FOR TELEPHONE JACKS AND CIRCUIT BOARDS INCORPORATING SUCH SUPPORTS

[75] Inventor: Roger Beun, Dunrobin, Canada

[73] Assignee: Northern Telecom Limited, Montreal, Canada

[21] Appl. No.: 356,199

[22] Filed: Mar. 8, 1982

[51] Int. Cl.³ .............................................. H05K 7/02
[52] U.S. Cl. .................................... 361/400; 361/413; 361/427
[58] Field of Search .................. 179/91 A, 95, 98; 339/17 C, 17 LC, 183, 176 R; 361/400, 413, 426, 427

[56] References Cited

U.S. PATENT DOCUMENTS

| | | | |
|---|---|---|---|
| 3,383,481 | 4/1968 | Bailey et al. | 361/400 X |
| 3,784,962 | 1/1974 | Byrd | 361/400 |
| 3,858,153 | 12/1974 | Coller et al. | 339/17 C |
| 4,060,295 | 11/1977 | Tomkiewicz | 339/17 LC |

Primary Examiner—A. T. Grimley
Assistant Examiner—Greg Thompson
Attorney, Agent, or Firm—Sidney T. Jelly

[57] ABSTRACT

An electrical jack is supported, at its front end, on a circuit board, by a thin flat member having an aperture therein which is a sliding fit over a tubular extension on the front end of the jack. The flat member has a tongue extending radially inward of the aperture, the tongue being bent or deformed on insertion of the tubular extension in the aperture. The tongue grips the extension and sustains the flat member in position prior to attachment to the board. Legs on the bottom edge of the flat member pass through the circuit board and are attached to the back surface of the board, as by soldering. Terminals at the rear end of the jack pass through the board and are connected to a circuit. The flat member can have a plurality of apertures, for the support of a plurality of jacks positioned together.

11 Claims, 6 Drawing Figures

SUPPORTS FOR TELEPHONE JACKS AND CIRCUIT BOARDS INCORPORATING SUCH SUPPORTS

This invention relates to supports for supporting the front end of telephone jacks and similar devices, mounted on circuit boards particularly printed circuit boards, and to a method of supporting jacks on circuit boards.

On a printed circuit board (PCB) jacks are attached at a back end by terminals which pass down through the board, to be soldered to electrical circuit patterns on the back surface of the board. The other end, the front end, of a jack is supported in the face plate attached to an edge of the PCB. The various electrical and electronic components are generally attached to the PCB by insertion of wires or terminals through the board, such insertion often done automatically. The components are then flow soldered to the circuit patterns on the back surface of the board.

Conventionally the components are mounted and flow soldered, prior to attachment of the face plate—which is usually of plastic. As it would be too difficult to avoid damage, and distortion, to the jacks if they were attached to the board at only the back end, with the front end unsupported until the face plate is attached, it is usual to leave the jacks off until the face plate is attached. Specifically, at attachment of the face plate, the jack is mounted on the PCB by insertion of terminals through the PCB, the face plate positioned on the edge of the PCB, extensions on the jack passing through bosses on the face plate, and then the face plate attached to the PCB. Finally, the terminals of the jack are hand soldered to the support pattern. This becomes fairly labour intensive.

The invention provides a support for positioning at the front end of a jack, the support including extensions or legs which pass through the PCB. By this means, the jacks can be mounted on the PCB, prior to wave soldering, and the whole assembly, including components, terminals of the jacks and the support extensions or legs flow soldered at the same time. It can be that the support of metal, also acts as a connection to the circuit pattern or to ground, or the extensions or legs of the support are soldered to electrically isolated areas on the back surface of the board. The front end of the jack includes a tubular member into which the plug is inserted. This tubular member fits in a boss on the front plate. The support comprises a thin sheet having one or more apertures which fit over tubular members of jacks. A support can have a single aperture, to support one jack, or a plurality of apertures to support a plurality of jacks. The support has a deflectable tang in the aperture which retains the support on the jack.

The invention will be readily understood by the following description of certain embodiments, by way of example, in conjunction with the accompanying drawings, in which.

FIG. 4 (a), (b) and (c) illustrates three forms of support.

Figure 2:
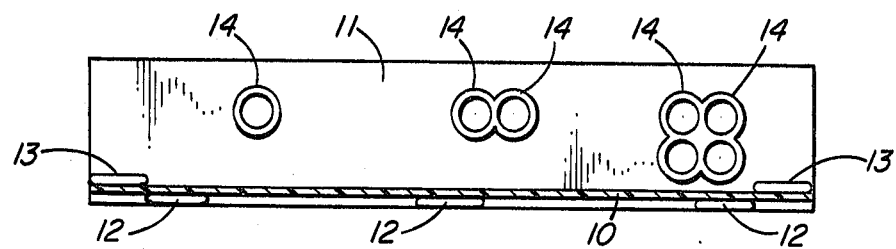
FIG. 2 is a view of the face plate, in the direction of arrow A in FIG. 1, but with jacks omitted.
Figure 1:
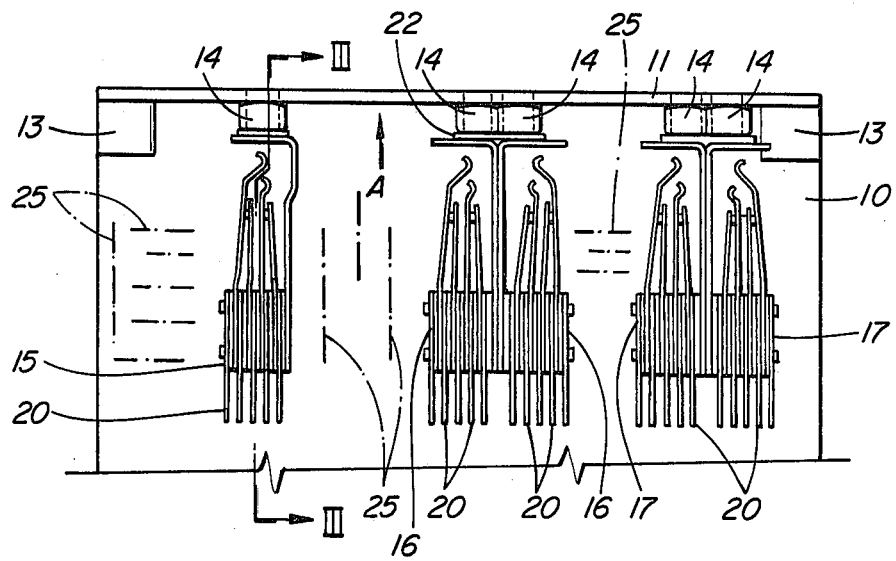
FIG. 1 is a top plan view of one end of a PCB with jacks mounted thereon.
Figure 3:
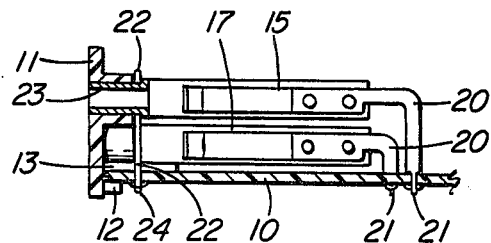
FIG. 3 is a cross-section on the line III—III of FIG. 1.

As seen in FIGS. 1, 2 and 3, a PCB 10 is attached at its front edge to a face plate 11. The PCB is located on the face plate by three small ribs or protrusions 12 at the bottom edge of the face plate and two large extensions 13, the PCB fitting between the ribs 12 and extensions 13. On the rear face of the face plate 11 are hollow bosses 14. The member, and disposition, of the bosses 14 will vary with requirements. FIGS. 1 and 2 illustrate, for convenience, three arrangements of jacks, a single jack 15, a double set of jacks 16, and a gradruple set of jacks 17.

FIG. 3 illustrates the mounting of the jacks on the PCB. At the back end of the jacks terminals 20 extend from the jack and round and down, with reduced dimension ends 21 passing through pre-drilled or punched holes in the PCB 10. At the front ends of the jacks a support 22 fits over a tubular member 23 of the jack and extends down to the PCB, with small extensions or legs 24 passing through holes in the PCB. At this stage, on critical assembly, the face plate would not be attached to the PCB, only the components, indicated diagrammatically at 25 in FIG. 1, and the jacks. The components and jacks are then wave soldered in position to the circuit, or circuits, on the undersurface of the board. The jacks are held firmly in position by the soldering of the terminals ends 21 and by the soldering of the extensions or legs 24 of the support 22.

Figure 4A:
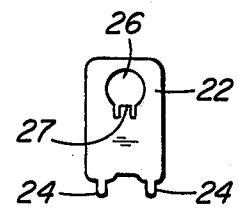

FIGS. 4(a), (b) and (c), illustrate three forms of support 22. A typical material for the supports is beryllium copper sheet or strip and they can readily be etch formed or stamped. The supports are generally tin coated. The thickness is, for example, about 0.010" but can vary.

FIG. 4(a) illustrates the basic arrangement, with the support 22 being in the form of a thin, flat plate-like member having an aperture 26 of a diameter to be a sliding fit on the tubular member 23 of a jack. A small tongue or tang 27 extends slightly into the aperture end when the support is pushed on to the tubular member of a jack, the tongue is bent out slightly from the plane of the support and acts to retain the support on the tubular member and also acts as a path to ground. The small extensions or legs 24 which pass through the PCB are also seen.

Figure 4B:
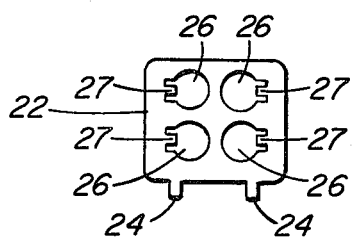
Figure 4C:
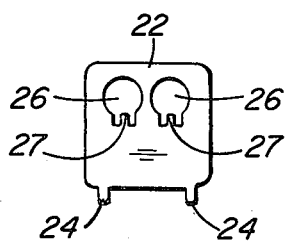

FIG. 4(b) illustrates an arrangement for supporting the front ends of four jacks arranged as a unit, while FIG. 4(c) shows a support for supporting two jacks. The positioning of the apertures 26, and the relative positioning of the tongues 27 can be varied to suit. For large supports, more than two legs 24 can be provided.

The supports are conveniently formed in sheets or strips, for easier manufacture, and plating. The individual supports are then separated prior to use.

Use of the supports provides a considerable reduction in labour costs. After insertion of components to a PCB, the jacks are mounted on the PCB and then the whole flow soldered. The face plate is then attached, with the tubular members 23 of the jacks sliding into the bosses 14 on the face plate. The jacks are firmly positioned and held on the PCB after soldering and the operation of hand soldering of the terminals is eliminated.

What is claimed is:

1. A support for supporting a front end of an electrical jack on a circuit board, comprising:

a thin, flat, plate-like metal member having at least one aperture thereon, the aperture of a dimension to be a sliding fit on a tubular extension at the front end of a jack;

a deformable tongue extending radially inward into said aperture;

at least two legs extending from a lower edge of the plate-like member, said legs positioned for passage through holes in the circuit board.

2. A support as claimed in claim 1, including two apertures in said plate-like member, for sliding over extensions on two jacks.

3. A support as claimed in claim 2, the apertures spaced laterally to accept extensions on jacks positioned side-by-side.

4. A support as claimed in claim 1, including four apertures in said plate-like member, for sliding over extensions on four jacks.

5. A support as claimed in claim 4, the apertures spaced with the centers of the apertures at the corners of a rectangle, to accept extensions on four jacks positioned as two pairs, the jacks of each pair being side-by-side, one pair positioned above the other pair.

6. A circuit board assembly comprising:
a printed circuit board;
at least one circuit pattern on an undersurface of the board;
a plurality of electrical components mounted on an upper surface of the board, and connected electrically to said circuit pattern;
at least one jack mounted on said upper surface adjacent a front edge of said board, said jack connected to said circuit pattern by terminals extending from a back end of the jack through said board, said jack including a tubular extension at front end;
a support at said front end of said jack, said support comprising a thin, flat, plate-like member having an aperture through which extends said tubular extension, a deformable tongue extending radially inward in said aperture in gripping engagement with the outer surface of said tubular extension, at least two legs extending from a lower edge of the plate-like member, the legs extending through said board, said lower edge of the plate-like member resting on a upper surface of the board.

7. An assembly as claimed in claim 6, including a face-plate extending along said front edge of the board and attached thereto, said face-plate including a hollow boss on a rear face, the tubular extension of said jack extending into said boss.

8. An assembly as claimed in claim 6, including at least two jacks mounted side-by-side on said board, said support including two apertures, a tubular extension on each jack extending through an aperture.

9. An assembly as claimed in claim 6, including at least two jacks mounted one above the other, tubular extensions on said jacks extending through apertures in said support.

10. An assembly as claimed in claim 8 or 9, including a face-plate extending along said front edge of the board and attached thereto, said face-plate including hollow bosses on a rear face, the tubular extensions on said jacks extending into said bosses.

11. A method of supporting an electrical jack on a circuit board, comprising:
passing terminals from a back end of said jack through holes in a circuit board and connecting said terminals to a circuit pattern on an under surface of the board;
positioning a support on a tubular extension at a front end of said jack, said support being a thin, flat, plate-like member having an aperture for fitting over said tubular extension, and including a radially inward projecting tongue in said aperture, said tongue being deformed on insertion of said tubular extension into said aperture to grip said tubular extension;
passing legs extending from a bottom edge of said plate-like member through holes adjacent a front edge of said board and connecting said legs to said undersurface of the board.

* * * * *